United States Patent
Yasuda et al.

(10) Patent No.: US 8,295,074 B2
(45) Date of Patent: Oct. 23, 2012

(54) MEMORY CELL

(75) Inventors: Shuichiro Yasuda, Kanagawa (JP); Katsuhisa Aratani, Aichi (JP); Akira Kouchiyama, Kanagawa (JP); Tetsuya Mizuguchi, Kanagawa (JP); Satoshi Sasaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 177 days.

(21) Appl. No.: 12/742,538

(22) PCT Filed: Nov. 27, 2008

(86) PCT No.: PCT/JP2008/071531
§ 371 (c)(1),
(2), (4) Date: May 12, 2010

(87) PCT Pub. No.: WO2009/069690
PCT Pub. Date: Jun. 4, 2009

(65) Prior Publication Data
US 2010/0259967 A1    Oct. 14, 2010

(30) Foreign Application Priority Data
Nov. 29, 2007 (JP) .............................. P2007-308916

(51) Int. Cl.
*G11C 11/00* (2006.01)
*G11C 11/36* (2006.01)

(52) U.S. Cl. .................. 365/148; 365/163; 365/175
(58) Field of Classification Search .................. 365/148, 365/163, 175
See application file for complete search history.

(56) References Cited

U.S. PATENT DOCUMENTS

| | | | |
|---|---|---|---|
| 6,980,465 B2 * | 12/2005 | Taussig et al. | 365/148 |
| 6,995,999 B2 * | 2/2006 | Morimoto | 365/148 |
| 7,184,295 B2 * | 2/2007 | Tsushima et al. | 365/148 |
| 7,336,520 B2 * | 2/2008 | Hachino et al. | 365/148 |
| 7,433,222 B2 * | 10/2008 | Hosoi et al. | 365/148 |
| 7,558,099 B2 * | 7/2009 | Morimoto | 365/148 |
| 7,560,724 B2 * | 7/2009 | Aratani et al. | 365/148 |
| 7,715,220 B2 * | 5/2010 | Tsushima et al. | 365/148 |
| 7,719,873 B2 * | 5/2010 | Hachino et al. | 365/148 |

(Continued)

FOREIGN PATENT DOCUMENTS
EP    2 128 901    10/2010
(Continued)

OTHER PUBLICATIONS

Krzysztof Szot, et al., "Switching the electrical resistance of individual dislocations in single-crystalline SrTio3", Nature Materials, Nature Publishing Group, Apr. 2006, pp. 312-320, vol. 5.

(Continued)

*Primary Examiner* — Trong Phan
(74) *Attorney, Agent, or Firm* — K&L Gates LLP

(57) ABSTRACT

A memory cell is provided, in which a resistance value is appropriately controlled, thereby a variable resistance element may be applied with a voltage necessary for changing the element into a high or low resistance state. A storage element 10, a nonlinear resistance element 20, and an MOS transistor 30 are electrically connected in series. The storage element 10 has a nonlinear current-voltage characteristic opposite to a nonlinear current-voltage characteristic of the MOS transistor 30, and changes into a high or low resistance state in accordance with a polarity of applied voltage. The nonlinear resistance element 20 has a nonlinear current-voltage characteristic similar to the nonlinear current-voltage characteristic of the storage element 10.

19 Claims, 13 Drawing Sheets

U.S. PATENT DOCUMENTS

| | | | |
|---|---|---|---|
| 7,724,562 B2 * | 5/2010 | Meyer et al. | 365/148 |
| 7,859,883 B2 * | 12/2010 | Shuy et al. | 365/148 |
| 7,876,605 B2 * | 1/2011 | Bolivar et al. | 365/148 |
| 7,894,239 B2 * | 2/2011 | Tamai et al. | 365/148 |
| 7,952,909 B2 * | 5/2011 | Inoue et al. | 365/148 |
| 7,990,754 B2 * | 8/2011 | Azuma et al. | 365/148 |
| 8,023,312 B2 * | 9/2011 | Yamazaki et al. | 365/148 |
| 8,085,577 B2 * | 12/2011 | Kanno et al. | 365/148 |

FOREIGN PATENT DOCUMENTS

| | | |
|---|---|---|
| JP | 2002-204006 | 7/2002 |
| JP | 2005-25914 | 1/2005 |
| JP | 6-76562 | 3/2005 |
| JP | 2005-197634 | 7/2006 |
| JP | 2006-196537 | 7/2006 |
| WO | 2008-117494 | 10/2008 |

OTHER PUBLICATIONS

Toshitsugu Sakamoto, et al., "Solid Electrolyte Memory", 2006, pp. 1126-1130.

Akihito Sawa, "Nonvolatile resistance-switching memory in transition-metal oxides", Correlated Electron Research Center, National Institute of Advanced Industrial Science and Technology (AIST), 2006, pp. 1109-1114.

Japanese Patent Office, Notice of reasons for refusal, issued in connection with Japanese Patent Application No. 2007-308916, dated Apr. 17, 2012. (4 pages).

* cited by examiner

MEMORY CELL

CROSS REFERENCE TO RELATED APPLICATIONS

The present application is a national stage of International Application No. PCT/JP2008/071531 filed on Nov. 27, 2008 and claims priority to Japanese Patent Application No. 2007-308916 filed on Nov. 29, 2007 the disclosures of which are incorporated herein by reference.

BACKGROUND

The present invention relates to a memory cell having a variable resistance element.

An NOR or an NAND flash memory has been typically used as a semiconductor nonvolatile memory for data storage. However, such a flash memory needs a high voltage for writing and erasing, and besides, is limited in number of electrons to be injected into a floating gate. Consequently, limitation in size reduction of the flash memory is pointed out.

At present, a resistance change memory such as PRAM (Phase Change Random Access Memory) or PMC (Programmable Metallization Cell) is proposed as a next-generation nonvolatile memory that may exceed a limit in size reduction of the nonvolatile memory (patent documents 1 and 2, and non-patent documents 1 to 3). Each of the memories described in the patent document 2 and the non-patent documents 1 to 3 has a simple structure where a resistance change layer is sandwiched between electrodes, and a memory described in the patent document 1 has a structure where an ion source layer and a resistance change layer are sandwiched between electrodes. In PMC or PRAM, it is considered that an atom or an ion is moved by heat or an electric field, so that a conduction path is formed, and consequently resistance change is exhibited.

Patent document 1: Japanese Unexamined Patent Application Publication No. 2006-196537
Patent document 2: Japanese Unexamined Patent Application Publication No. 2006-322188
Non-patent document 1: Szot, et al., Nature Material, 1614, p. 312 (2006)
Non-patent document 2: Sakamoto, et al., Solid Electrolyte Memory, OYO BUTURI, 75, p. 1126, September 2006
Non-patent document 3: Sawa, Resistance-Change Nonvolatile Memory Using Transition-Metal Oxide, OYO BUTURI, 75, p. 1109, September 2006

DISCLOSURE OF SUMMARY

Recording data need to be multivalued in order to manufacture a resistance change memory being inexpensive compared with a flash memory. While most of resistance change memories may be principally multivalued, a resistance value of a resistance change memory needs to be appropriately controlled in order to actually achieve multivalence in the memory.

Typically, in the resistance change memory, a variable resistance element as a storage element is connected in series with a transistor or a current-limiting protective resistance, so that the transistor or the current-limiting protective resistance limits a current flowing into the variable resistance element, thereby a resistance value of the variable resistance element is determined.

For example, as shown in FIG. 19, the resistance change memory includes memory cells 100 arranged in matrix as storage units, each memory cell including a storage element 110 and a transistor 120 connected in series with each other, in which one end of the storage element 110 is electrically connected to a source line S, and the other end of the storage element 110 is electrically connected to a drain (not shown) of the transistor 120. Furthermore, a source (not shown) of the transistor 120 is electrically connected to a bit line B, and a gate (not shown) of the transistor 120 is electrically connected to a word line W. In the resistance change memory, the transistor 120 limits a current flowing into the storage element 110.

However, a current-voltage characteristic of a variable resistance element is not ohmic, and is nonlinear in such a manner that current is proportional to voltage raised to a power being larger than one. This has caused a problem that when a voltage applied to the resistance change memory is increased, the resistance change element is not easily applied with a voltage necessary for changing the element into a high or low resistance state due to current limitation of the transistor.

In addition, the resistance change memory has had a problem that when a writing voltage and an erasing voltage are repeatedly applied to the resistance change element, erasing resistance is gradually increased with increase in repetition rate.

In view of the foregoing problems, it is an object to provide a memory cell in which a resistance value is appropriately controlled, thereby a variable resistance element may be applied with a voltage necessary for changing the element into a high or low resistance state, or a stable erasing resistance independent of a repetition rate may be achieved.

A first memory cell of the invention includes an MOS transistor, a storage element, and a first nonlinear resistance element, those being electrically connected in series. The storage element has a nonlinear current-voltage characteristic opposite to a nonlinear current-voltage characteristic of the MOS transistor, and changes into a high or low resistance state in accordance with a polarity of applied voltage. On the other hand, the first nonlinear resistance element has a nonlinear current-voltage characteristic similar to the nonlinear current-voltage characteristic of the storage element.

In the first memory cell of the invention, the first nonlinear resistance element having the nonlinear current-voltage characteristic opposite to the nonlinear current-voltage characteristic of the MOS transistor is electrically connected in series with the MOS transistor and the storage element having the nonlinear current-voltage characteristic opposite to the nonlinear current-voltage characteristic of the MOS transistor. Thus, when the first memory cell is applied with a voltage so that the storage element is applied with a voltage necessary for changing the storage element into a high or low resistance state, the MOS transistor is applied with a voltage divided by the storage element and the first nonlinear resistance element. Therefore, a voltage applied to the first memory cell may be controlled to have a value within a range where current is not significantly limited by the MOS transistor.

A second memory cell of the invention includes an MOS transistor electrically connected in series with a storage element electrically connected in parallel with a nonlinear resistance element. The storage element has a nonlinear current-voltage characteristic opposite to a nonlinear current-voltage characteristic of the MOS transistor, and changes into a high or low resistance state in accordance with a polarity of applied voltage. On the other hand, the nonlinear resistance element has a nonlinear current-voltage characteristic similar to the nonlinear current-voltage characteristic of the storage element, and has a lower resistance value than a resistance value of the storage element in a high-resistance state of the storage element.

In the second memory cell of the invention, the nonlinear resistance element having the nonlinear current-voltage characteristic opposite to the nonlinear current-voltage characteristic of the MOS transistor, and having the lower resistance value than the resistance value of the storage element is electrically connected in parallel with the storage element, and electrically connected in series with the MOS transistor. The nonlinear resistance element has the lower resistance value than the resistance value of the storage element. Therefore, in a high-resistance state of the storage element, the resistance value of the nonlinear resistance element connected in parallel with the storage element is dominant for a resistance value of the second memory cell as a whole compared with the resistance value of the storage element.

A third memory cell of the invention includes an MOS transistor, a storage element, and a nonlinear resistance element, those being electrically connected in series. The storage element has a first electrode, an interlayer separation film having an opening and being contacted to the first electrode, a resistance change layer being contacted to the interlayer separation film and contacted to the first electrode via the opening, an ion source layer being contacted to the resistance change layer, and a second electrode being contacted to the ion source layer. The resistance change layer has a nonlinear current-voltage characteristic opposite to a nonlinear current-voltage characteristic of the MOS transistor, and changes into a high or low resistance state in accordance with a polarity of applied voltage. The nonlinear resistance element has a nonlinear current-voltage characteristic similar to the nonlinear current-voltage characteristic of the resistance change layer.

In the third memory cell of the invention, the nonlinear resistance element having the nonlinear current-voltage characteristic opposite to the nonlinear current-voltage characteristic of the MOS transistor is electrically connected in series with the MOS transistor and the storage element having the nonlinear current-voltage characteristic opposite to the nonlinear current-voltage characteristic of the MOS transistor. Thus, when the third memory cell is applied with a voltage so that the storage element is applied with a voltage necessary for changing the storage element into a high or low resistance state, the MOS transistor is applied with a voltage divided by the storage element and the nonlinear resistance element. Therefore, a voltage applied to the third memory cell may be controlled to have a value within a range where current is not significantly limited by the MOS transistor.

A fourth memory cell of the invention includes an MOS transistor and a storage element electrically connected in series with each other. The storage element has a first electrode, an interlayer separation film having an opening and being contacted to the first electrode, a resistance change layer being contacted to the interlayer separation film and contacted to the first electrode via the opening, an ion source layer being contacted to the resistance change layer, and a second electrode being contacted to the ion source layer. The resistance change layer has a nonlinear current-voltage characteristic opposite to a nonlinear current-voltage characteristic of the MOS transistor, and changes into a high or low resistance state in accordance with a polarity of applied voltage. The interlayer separation film has a nonlinear current-voltage characteristic similar to the nonlinear current-voltage characteristic of the resistance change layer, and has a lower resistance value than a resistance value of the resistance change layer in a high-resistance state of the resistance change layer.

In the fourth memory cell of the invention, the interlayer separation film having the nonlinear current-voltage characteristic opposite to the nonlinear current-voltage characteristic of the MOS transistor, and having the lower resistance value than the resistance value of the resistance change layer is electrically connected in parallel with the resistance change layer, and electrically connected in series with the MOS transistor. The interlayer separation film has the lower resistance value than the resistance value of the resistance change layer. Therefore, in a high-resistance state of the resistance change layer, the resistance value of the interlayer separation film connected in parallel with the resistance change layer is dominant for a resistance value of the fourth memory cell as a whole compared with the resistance value of the resistance change layer.

A fifth memory cell of the invention includes an MOS transistor and a storage element electrically connected in series with each other. The storage element has a first electrode, an interlayer separation film having an opening and being contacted to the first electrode, a voltage control film being contacted to the interlayer separation film and contacted to the first electrode via the opening, a resistance change layer being contacted to the voltage control film, and a second electrode being contacted to the resistance change layer. The resistance change layer has a nonlinear current-voltage characteristic opposite to a nonlinear current-voltage characteristic of the MOS transistor, and changes into a high or low resistance state in accordance with a polarity of applied voltage. The voltage control film has a nonlinear current-voltage characteristic similar to the nonlinear current-voltage characteristic of the resistance change layer, and has a lower resistance value than a resistance value of the resistance change layer in a high-resistance state of the resistance change layer.

In the fifth memory cell of the invention, the voltage control film having the nonlinear current-voltage characteristic opposite to the nonlinear current-voltage characteristic of the MOS transistor, and having the lower resistance value than the resistance value of the resistance change layer is, in the opening, electrically connected in series with a region of the resistance change layer opposed to the opening, and a region of the voltage control film and a region of the interlayer separation film, each region corresponding to the periphery of the opening, are electrically connected in parallel with the region of the resistance change layer and a region of the voltage control film, each region being opposed to the opening. Thus, when the fifth memory cell is applied with a voltage so that the resistance change layer is applied with a voltage necessary for changing the resistance change layer into a high or low resistance state, the MOS transistor is applied with a voltage divided by the resistance change layer and the voltage control film. Therefore, a voltage applied to the fifth memory cell may be controlled to have a value within a range where current is not significantly limited by the MOS transistor. The interlayer separation film has the lower resistance value than the resistance value of the resistance change layer. Therefore, in a high-resistance state of the resistance change layer, a resistance value of the region of the voltage control film and the region of the interlayer separation film connected in parallel with regions of the films opposed to the opening is dominant for a resistance value of the fifth memory cell as a whole compared with a resistance value of the region of the resistance change layer and the region of the voltage control film, each region being opposed to the opening.

According to the first memory cell of the invention, since the first nonlinear resistance element having the nonlinear current-voltage characteristic opposite to the nonlinear current-voltage characteristic of the MOS transistor is electrically connected in series with the MOS transistor and the storage element having the nonlinear current-voltage characteristic opposite to the nonlinear current-voltage characteristic of the MOS transistor, a voltage applied to the first memory cell may be controlled to have a value within a range where current is not significantly limited by the MOS transistor. Thus, the storage element may be applied with a voltage necessary for changing the element into a high or low resistance state.

According to the second memory cell of the invention, the nonlinear resistance element having the nonlinear current-voltage characteristic opposite to the nonlinear current-voltage characteristic of the MOS transistor, and having the lower resistance value than the resistance value of the storage element is electrically connected in parallel with the storage element, and electrically connected in series with the MOS transistor. Therefore, in a high-resistance state of the storage element, the resistance value of the nonlinear resistance element connected in parallel with the storage element is dominant for a resistance value of the second memory cell as a whole compared with the resistance value of the storage element. Thus, stable erasing resistance independent of a repetition rate may be achieved.

According to the third memory cell of the invention, since the nonlinear resistance element having the nonlinear current-voltage characteristic opposite to the nonlinear current-voltage characteristic of the MOS transistor is electrically connected in series with the MOS transistor and the storage element having the nonlinear current-voltage characteristic opposite to the nonlinear current-voltage characteristic of the MOS transistor, a voltage applied to the third memory cell may be controlled to have a value within a range where current is not significantly limited by the MOS transistor. Thus, the storage element may be applied with a voltage necessary for changing the element into a high or low resistance state.

According to the fourth memory cell of the invention, the interlayer separation film having the nonlinear current-voltage characteristic opposite to the nonlinear current-voltage characteristic of the MOS transistor, and having the lower resistance value than the resistance value of the resistance change layer is electrically connected in parallel with the resistance change layer, and electrically connected in series with the MOS transistor. Therefore, in a high-resistance state of the resistance change layer, the resistance value of the interlayer separation film connected in parallel with the resistance change layer is dominant for a resistance value of the fourth memory cell as a whole compared with the resistance value of the resistance change layer. Thus, stable erasing resistance independent of a repetition rate may be achieved.

According to the fifth memory cell of the invention, the voltage control film having the nonlinear current-voltage characteristic opposite to the nonlinear current-voltage characteristic of the MOS transistor, and having the lower resistance value than the resistance value of the resistance change layer is, in the opening, electrically connected in series with the region of the resistance change layer opposed to the opening, and the region of the voltage control film and the region of the interlayer separation film, each region being corresponding to the periphery of the opening, are electrically connected in parallel with the region of the resistance change layer and the region of the voltage control film, each region being opposed to the opening. Therefore, a voltage applied to the fifth memory cell may be controlled to have a value within a range where current is not significantly limited by the MOS transistor. Thus, the storage element may be applied with a voltage necessary for changing the element into a high or low resistance state. In a high-resistance state of the resistance change layer, the resistance value of the region of the voltage control film and the region of the interlayer separation film connected in parallel with the regions of the films opposed to the opening is dominant for a resistance value of the fifth memory cell as a whole compared with the resistance value of the region of the resistance change layer and the region of the voltage control film, each region being opposed to the opening. Thus, stable erasing resistance independent of a repetition rate may be achieved.

Additional features and advantages of the present invention are described in, and will be apparent from, the following Detailed Description and the Figures.

DETAILED DESCRIPTION

Hereinafter, embodiments of the invention will be described in detail with reference to drawings.

First Embodiment

Figure 1:
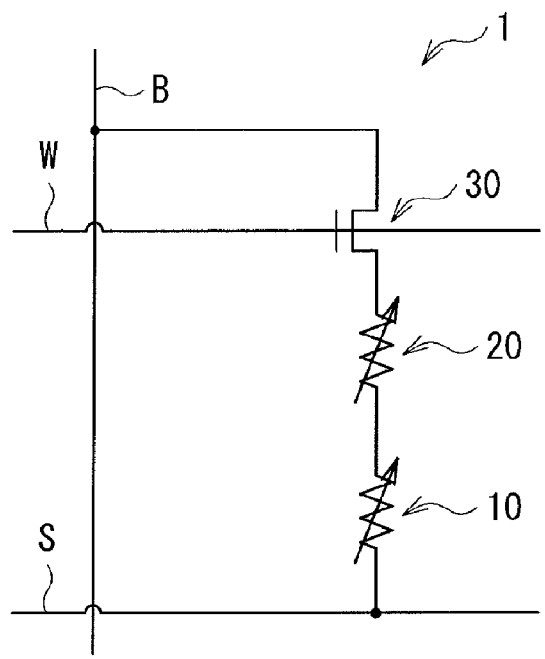
FIG. 1 is a circuitry diagram of a memory cell according to a first embodiment of the invention.

A storage device according to a first embodiment of the invention includes memory cells 1 arranged in matrix as storage units. FIG. 1 shows the memory cell 1 of the storage device in an enlarged manner. The memory cell 1 is formed by connecting a storage element 10, a nonlinear resistance element 20, and an MOS (Metal Oxide Semiconductor) transistor 30 in series.

Figure 2:
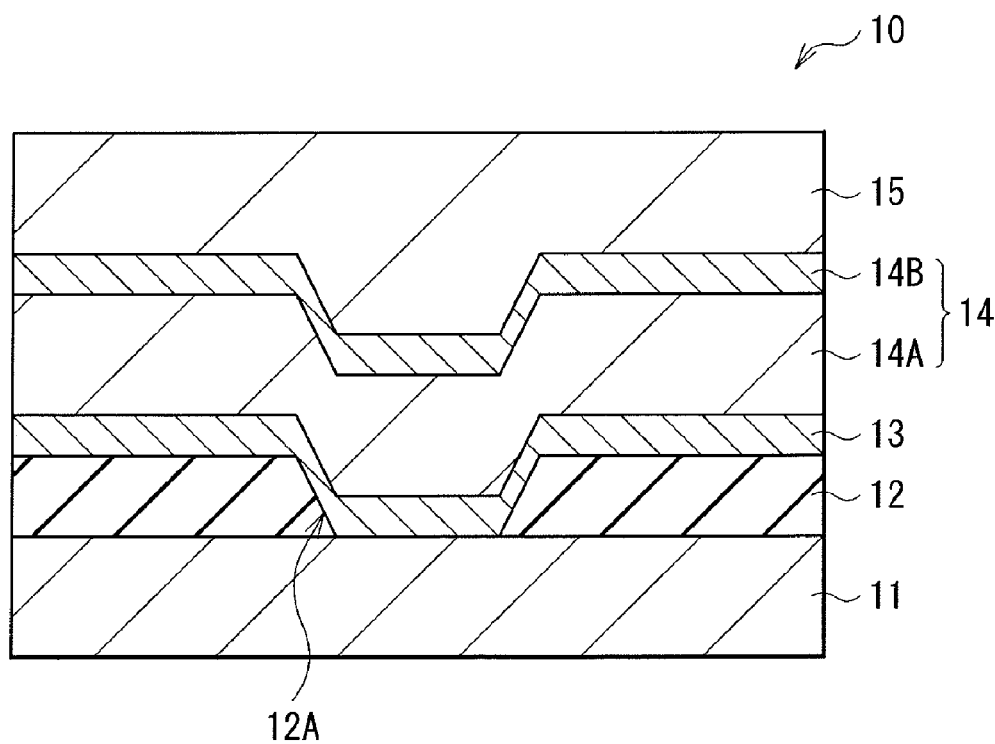
FIG. 2 is a sectional configuration diagram of a storage element in FIG. 1.

FIG. 2 shows an example of a sectional configuration of the storage element 10. The storage element 10 is formed by stacking an electrode 11, an interlayer insulating film 12, a resistance change layer 13, an ion source layer 14, and an electrode 15 in this order. The electrode 11 is electrically connected to a source line S, and the electrode 15 is electrically connected to a drain (not shown) of the MOS transistor 30 via the nonlinear resistance element 20. A source (not shown) of the MOS transistor 30 is electrically connected to a bit line B, and a gate (not shown) of the MOS transistor 30 is electrically connected to a word line W.

Here, each of the electrodes 11 and 15 includes a wiring material used for a semiconductor process, for example, TiW, Ti, W, WN, Cu, Al, Mo, Ta, TaN or a silicide. The interlayer insulating film 12 includes an insulating material such as a hard-cured photoresist, $SiO_2$, $Si_3N_4$, an inorganic material (for example, SiON, SiOF, $Al_2O_3$, $Ta_2O_5$, $HfO_2$ or $ZrO_2$), a fluorine series organic material, or an aromatic series organic material. As shown in FIG. 2, the interlayer insulating film 12 has an opening 12A running through the interlayer insulating film 12, and is contacted to the electrode 11, and the electrode 11 and the resistance change layer 13 are thus contacted to each other via the opening 12A. Specifically, a region of the resistance change layer 13 opposed to the opening 12A of the interlayer insulating film 12 is contacted to the electrode 11, and a region of the resistance change layer 13 other than the region thereof opposed to the opening 12A of the interlayer insulating film 12 is contacted to the interlayer insulating film 12, and oppositely disposed to the electrode 11 via the interlayer insulating film 12. The resistance change layer 13 includes an insulating material or a semiconductor material, specifically, a rare-earth oxide, a rare-earth nitride, a silicon oxide, or a silicon nitride, and, for example, includes GdOx. The resistance change layer 13 has a function of changing into a high or low resistance state depending on a direction of an electric field (polarity of voltage) generated between the electrodes 11 and 15 by applying a voltage between the electrodes 11 and 15 as will be described later.

The ion source layer 14 has a double-layer structure where a first ion source layer 14A contacted to the resistance change layer 13 and a second ion source layer 14B contacted to the electrode 15 are stacked, for example, as shown in FIG. 2. The first ion source layer 14A includes, for example, at least one of metal elements of Cu, Ag and Zn, and at least one of chalcogen elements of Te, S and Se, and, for example, includes CuTeSi, GeSbTeSi, CuGeTeSi, AgTeSi, AgGeTeSi, ZnTeSi, ZnGeTeSi, CuSSi, CuGeSSi, CuSeSi, or CuGeSeSi. The second ion source layer 14B includes, for example, Zr and at least one of metal elements of Cu, Ag and Zn, and, for example, includes CuZr, CuGeZr, AgZr, AgGeZr, ZnZr, or ZnGeZr.

Here, each of Cu, Ag and Zn is an element easily moving within the ion source layer 14 or within the resistance change layer 13 in an ionized state. Si is an element that prevents crystallization of the ion source layer 14 so that crystallization temperature of the ion source layer 14 may be increased. Therefore, an appropriate amount of Si is contained in the ion source layer 14, which may suppress change in state such as crystallization due to heat received during process. Consequently, stability of memory operation may be improved.

Figure 3:
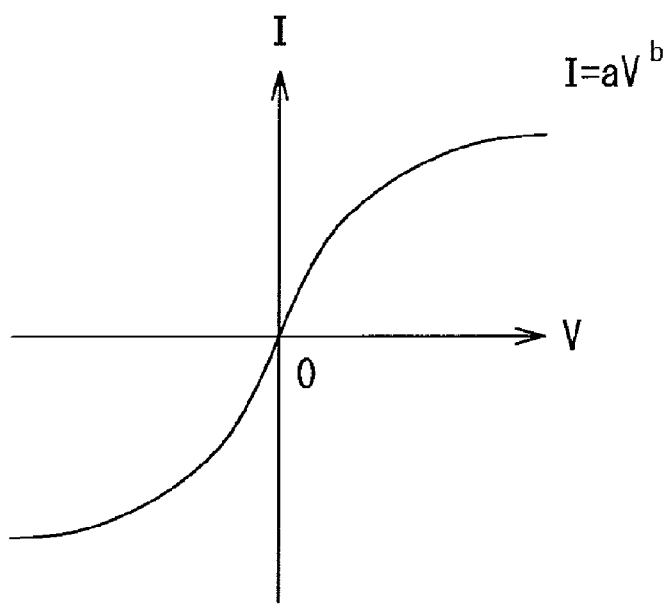
FIG. 3 is a current-voltage characteristic diagram of an MOS transistor in FIG. 1.
Figure 4:
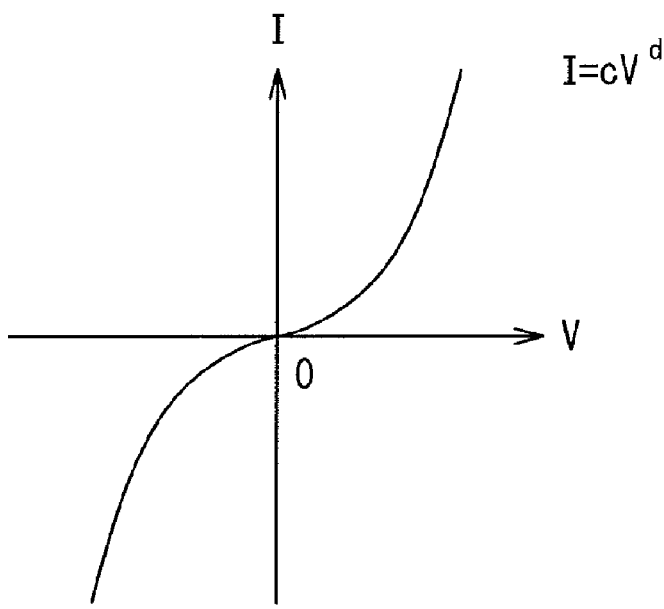
FIG. 4 is a current-voltage characteristic diagram of the storage element in FIG. 1.

In the meantime, the MOS transistor 30 typically has a nonlinear current-voltage characteristic expressed by $I=aV^b$ (I is a current flowing through the MOS transistor 30, V is a voltage applied to the MOS transistor 30, a is a coefficient, and b is a power less than 1) as shown in FIG. 3. Therefore, since a flow rate of current is less increased (that is, the MOS transistor 30 is saturated) with increase in applied voltage, the MOS transistor 30 acts as a protective resistance limiting a current flowing into the storage element 10. In contrast, in the storage element 10, the resistance change layer 13 largely has a nonlinear current-voltage characteristic opposite to the nonlinear current-voltage characteristic of the MOS transistor 30, and specifically has a nonlinear current-voltage characteristic expressed by $I=cV^d$ (I is a current flowing through the storage element 10, V is a voltage applied to the storage element 10, c is a coefficient, and d is a power larger than 1) as shown in FIG. 4. Therefore, when the memory cell 1 is applied with a voltage within a range where current is not significantly limited by the MOS transistor 30, a voltage applied to the storage element 10 is increased with increase in voltage applied to the memory cell 1, and a current flowing into the storage element 10 is increased in proportion to a voltage, which is applied to the storage element 10, to the power of d.

Figure 5:
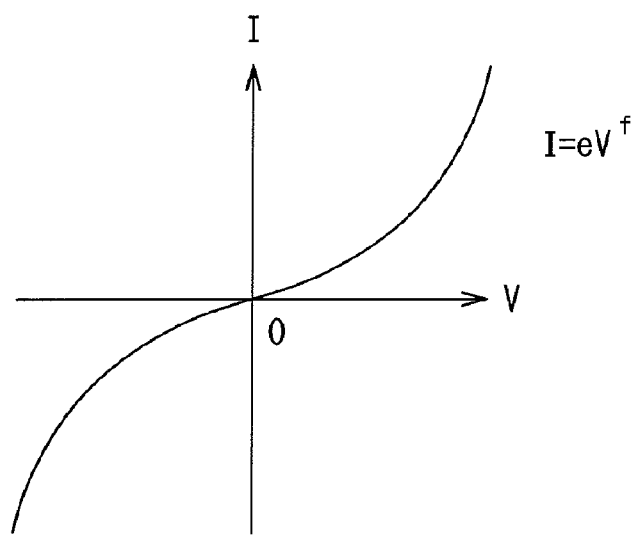
FIG. 5 is a current-voltage characteristic diagram of a nonlinear resistance element in FIG. 1.

The nonlinear resistance element 20 has, for example, the same stacking structure as that of the storage element 10, in which a resistance change layer largely has a nonlinear current-voltage characteristic similar to the nonlinear current-voltage characteristic of the storage element 10, namely, has a nonlinear current-voltage characteristic opposite to the nonlinear current-voltage characteristic of the MOS transistor 30. The nonlinear resistance element 20 has a nonlinear current-voltage characteristic expressed by $I=eV^f$ (I is a current flowing through the nonlinear resistance element 20, V is a voltage applied to the nonlinear resistance element 20, e is a coefficient, and f is a power larger than 1) as shown in FIG. 5. Therefore, when the memory cell 1 is applied with a voltage within a range where current is not significantly limited by the MOS transistor 30, a voltage applied to the nonlinear resistance element 20 is increased with increase in voltage applied to the memory cell 1, and a current flowing into the nonlinear resistance element 20 is increased in proportion to a voltage, which is applied to the nonlinear resistance element 20, to the power of f.

The power f has a value smaller than a value of the power d of the storage element 10, and a resistance value of the nonlinear resistance element 20 is smaller than a resistance value of the storage element 10. Thus, a flow rate of the current is less increased with increase in the applied voltage. Therefore, the nonlinear resistance element 20 acts as a protective resistance limiting a current flowing into the storage element 10 like the MOS transistor 30.

Operation of the storage device (memory cell 1) of the embodiment will be described.

(Writing)

When the electrode 15 is applied with positive potential (plus potential), and the electrode 11 is applied with negative potential (minus potential) or zero potential, so that a current is flowed from the ion source layer 14 to the resistance change layer 13, at least one kind of metal elements of Cu, Ag and Zn is ionized from the ion source layer 14 and diffused within the resistance change layer 13, and such metal ions are coupled with electrons on an electrode 11 side and thus precipitated, or remain diffused within the resistance change layer 13. As a result, a current path containing at least one kind of metal elements of Cu, Ag and Zn in large amount is formed within the resistance change layer 13, or a large amount of defects due to at least one kind of metal elements of Cu, Ag and Zn are formed within the resistance change layer 13, leading to reduction in resistance value of the resistance change layer 13. In such a case, since a resistance value of the ion source layer 14 is originally low compared with a resistance value of the resistance change layer 13 before recording, such reduction in resistance value of the resistance change layer 13 leads to reduction in resistance value of the storage element 10 as a whole (that is, the storage element 10 is turned on). Resistance of the storage element 10 as a whole in such a condition corresponds to writing resistance.

After that, the voltage applied between the electrodes 11 and 15 is decreased to zero so that a voltage applied to the storage element 10 is zero. Thus, the resistance value of the storage element 10 is kept low. In this way, recording (writing) of information is performed.

(Erasing)

Next, when the electrode 15 is applied with negative potential (minus potential), and the electrode 11 is applied with positive potential (plus potential) or zero potential, so that a current is flowed from the resistance change layer 13 to the ion source layer 14, at least one kind of metal elements of Cu, Ag and Zn configuring the current path or impurity levels, which has been formed within the resistance change layer 13, is ionized and moved back through the resistance change layer 13 to the ion source layer 14 side. As a result, the current path or defects disappear from the inside of the resistance change layer 13, leading to increase in resistance value of the resistance change layer 13. In such a case, since the resistance value of the ion source layer 14 is originally low, such increase in resistance value of the resistance change layer 13 leads to increase in resistance value of the storage element 10 as a whole (that is, the storage element 10 is turned off). In addition, resistance of the storage element 10 as a whole in such a condition corresponds to erasing resistance.

After that, the voltage applied between the electrodes 11 and 15 is decreased to zero so that a voltage applied to the storage element 10 is zero. Thus, the resistance value of the storage element 10 is kept high. In this way, recorded information is erased.

Such a process is repeatedly performed, thereby recording (writing) of information on the storage element 10 and erasing of recorded information may be repeatedly performed.

At this time, for example, when the state where resistance of the storage element 10 as a whole is writing resistance (state of low resistance value) is assigned to information of "1", and when the state where resistance of the storage element 10 as a whole is erasing resistance (state of high resistance value) is assigned to information of "0", information of the storage element 10 may be changed from "0" to "1" by applying positive potential (plus potential) to the electrode 15, and information of the storage element 10 may be changed from "1" to "0" by applying negative potential (minus potential) to the electrode 15.

In this way, in the embodiment, since the storage element 10, including a simple structure where the electrode 11, the interlayer insulating film 12, the resistance change layer 13, the ion source layer 14, and the electrode 15 are merely stacked in this order, is used to record and erase information, even if the storage element 10 is increasingly reduced in size, recording and erasing of information may be easily performed. Moreover, even if power is not supplied, a resistance value of the resistance change layer 13 may be kept. Therefore, information may be stored for a long period. Moreover, since a resistance value of the resistance change layer 13 is not affected by reading, flesh operation is unnecessary, therefore power consumption may be correspondingly reduced.

In the embodiment, the nonlinear resistance element 20, which has the nonlinear current-voltage characteristic similar to the nonlinear current-voltage characteristic of the storage element 10, namely, has the nonlinear current-voltage characteristic opposite to the nonlinear current-voltage characteristic of the MOS transistor 30, is electrically connected in series with the storage element 10, and acts as a protective resistance limiting a current flowing into the storage element 10 in addition to the MOS transistor 30. Thus, when the memory cell 1 is applied with a voltage so that the storage element 10 is applied with a voltage necessary for changing the storage element 10 into a high or low resistance state, the MOS transistor 30 is applied with a voltage divided by the storage element 10 and the nonlinear resistance element 20. Therefore, a voltage applied to the memory cell 1 may be controlled to have a value within a range where current is not significantly limited by the MOS transistor 30.

Figure 6:
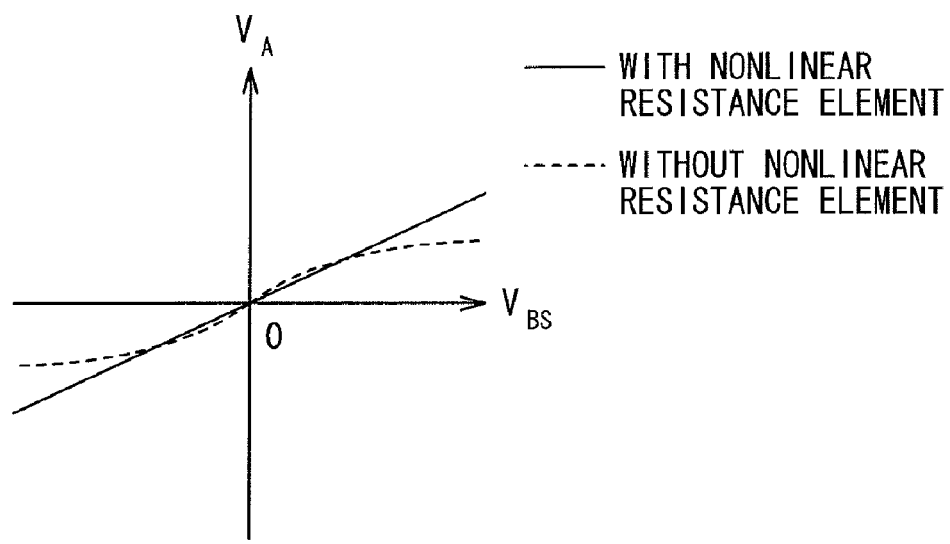
FIG. 6 is a characteristic diagram for illustrating a partial pressure ratio of the memory cell of FIG. 1.

As a result, in the embodiment, when a high voltage ($V_{BS}$) is applied to the memory cell 1, a voltage ($V_A$) applied to the storage element 10 may be increased in accordance with magnitude of the voltage ($V_{BS}$) applied to the memory cell 1, for example, as shown by a solid line in FIG. 6. On the other hand, in the past, when a high voltage ($V_{BS}$) is applied to the memory cell 1, a voltage ($V_A$) applied to the storage element 10 has been hardly increased due to current limitation of the MOS transistor 30, for example, as shown by a dashed line in FIG. 6. Therefore, in the embodiment, the storage element 10 may be applied with a voltage necessary for changing the storage element 10 into a high or low resistance state.

Figure 20:
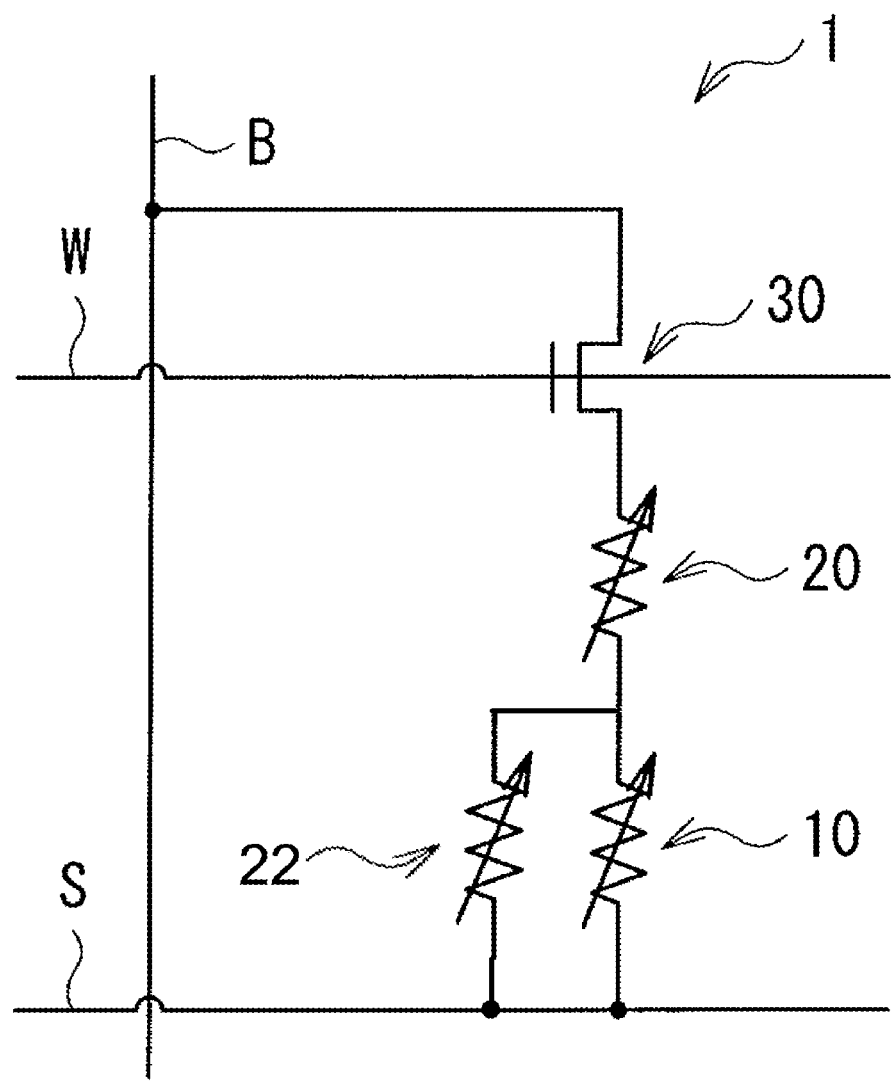
FIG. 20 is a circuitry diagram of the memory cell of FIG. 1 with the addition of a nonlinear resistance element in parallel with a storage element.

FIG. 20 shows the memory cell 1 of FIG. 1 with the addition of a second nonlinear resistance element 22 electrically connected in parallel with the storage element 10. The second nonlinear resistance element 22 has a nonlinear current-voltage characteristic similar to the nonlinear current-voltage characteristic of the storage element 10. The second nonlinear resistance element 22 also has a resistance value lower than a resistance value of the storage element 10 in a high-resistance state of the storage element.

Second Embodiment

Figure 7:
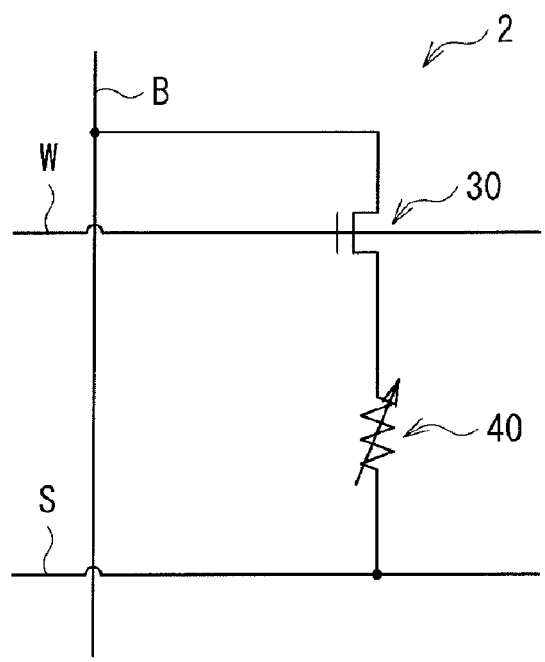
FIG. 7 is a circuitry diagram of a memory cell according to a second embodiment of the invention.
Figure 8:
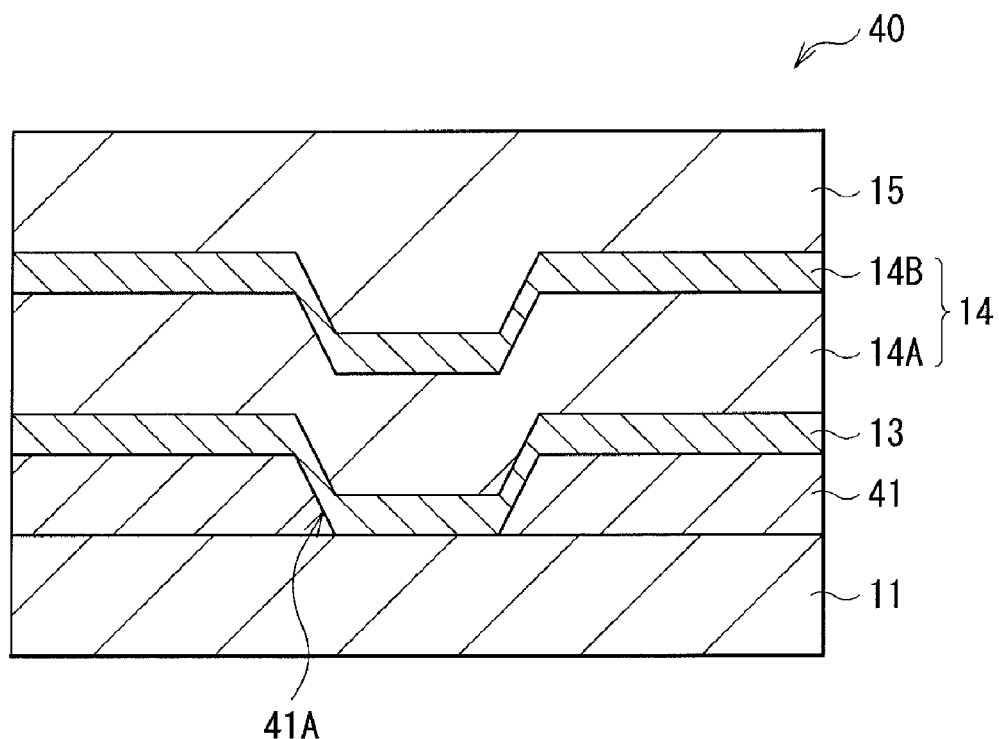
FIG. 8 is a sectional configuration diagram of a storage element in FIG. 7.

A storage device according to a second embodiment of the invention includes memory cells 2 arranged in matrix as storage units. FIG. 7 shows the memory cell 2 of the storage device in an enlarged manner. The memory cell 2 is formed by connecting a storage element 40 and an MOS transistor 30 in series. FIG. 8 shows an example of a sectional configuration of the storage element 40. The storage element 40 is formed by stacking an electrode 11, a voltage control film 41, a resistance change layer 13, an ion source layer 14, and an electrode 15 in this order. That is, the memory cell 2 corresponds to the memory cell 1 of the first embodiment in which the nonlinear resistance element 20 is removed from the memory cell 1, and the interlayer insulating film 12 is replaced by the voltage control film 41 in the storage element 10 of the first embodiment.

As shown in FIG. 8, the voltage control film 41 has an opening 41A running through the voltage control film 41, and is contacted to the electrode 11, and the electrode 11 and the resistance change layer 13 are thus contacted to each other via the opening 41A. Specifically, a region of the resistance change layer 13 opposed to the opening 41A of the voltage control film 41 is contacted to the electrode 11, and a region of the resistance change layer 13 other than the region thereof opposed to the opening 41A of the voltage control film 41 is contacted to the voltage control film 41, and is oppositely disposed to the electrode 11 via the voltage control film 41.

The voltage control film 41 includes a material having a resistance value lower than a resistance value of the resistance change layer 13 in a high-resistance state of the resistance change layer 13, for example, includes SiWN. Thus, in the storage element 40, a resistance component (hereinafter, called first resistance component) formed by a region of the resistance change layer 13 and a region of the ion source layer 14, each region being corresponding to the opening 41A, and a resistance component (hereinafter, called second resistance component) formed by the periphery of the regions (a region of the resistance change layer 13 and a region of the ion source layer 14, each region being corresponding to the periphery of the opening 41A, and the voltage control film 41) are electrically connected in parallel with each other by the electrodes 11 and 15.

Here, the first resistance component has a nonlinear current-voltage characteristic opposite to a nonlinear current-voltage characteristic of the MOS transistor 30. As in the storage element 10 of the above embodiment, the first resistance component has the nonlinear current-voltage characteristic opposite to the nonlinear current-voltage characteristic of the MOS transistor 30, and specifically has a nonlinear current-voltage characteristic expressed by $I=cV^d$ (I is a current flowing through the first resistance component, V is a voltage applied to the first resistance component, c is a coefficient, and d is a power larger than 1) as shown in FIG. 4. Therefore, when the memory cell 2 is applied with a voltage within a range where current is not significantly limited by the MOS transistor 30, a voltage applied to the first resistance component is increased with increase in voltage applied to the memory cell 2, and a current flowing into the first resistance component is increased in proportion to a voltage, which is applied to the first resistance component, to the power of d.

The second resistance component has a nonlinear current-voltage characteristic similar to the nonlinear current-voltage characteristic of the first resistance component, namely, has a nonlinear current-voltage characteristic opposite to the nonlinear current-voltage characteristic of the MOS transistor 30. The second resistance component has a nonlinear current-voltage characteristic expressed by $I=eV^f$ (I is a current flowing through the second resistance component, V is a voltage applied to the second resistance component, e is a coefficient, and f is a power larger than 1) as shown in FIG. 5. Therefore, when the memory cell 2 is applied with a voltage within a range where current is not significantly limited by the MOS transistor 30, a voltage applied to the second resistance component is increased with increase in voltage applied to the memory cell 2, and a current flowing into the second resistance component is increased in proportion to a voltage, which is applied to the second resistance component, to the power of f.

The power f has a value smaller than a value of the power d of the first resistance component, and a resistance value of the second resistance component is smaller than a resistance value of the first resistance component. Therefore, in a high-resistance state of the first resistance component, the second resistance component connected in parallel with the first resistance component is dominant for a resistance value of the storage element 40 as a whole compared with the first resistance component.

Thus, in the embodiment, even if when a writing voltage and an erasing voltage are repeatedly applied to the storage element 40, the first resistance component after applying the erasing voltage is gradually increased with increase in repetition rate, the second resistance component connected in parallel with the first resistance component is dominant for the resistance value of the storage element 40 as a whole compared with the first resistance component. This may stabilize a resistance value (erasing resistance) of the storage element 40 as a whole after applying the erasing voltage. As a result, since stable erasing resistance independent of a repetition rate may be achieved, multivalence may be achieved on at least an erasing resistance side.

Figure 21:
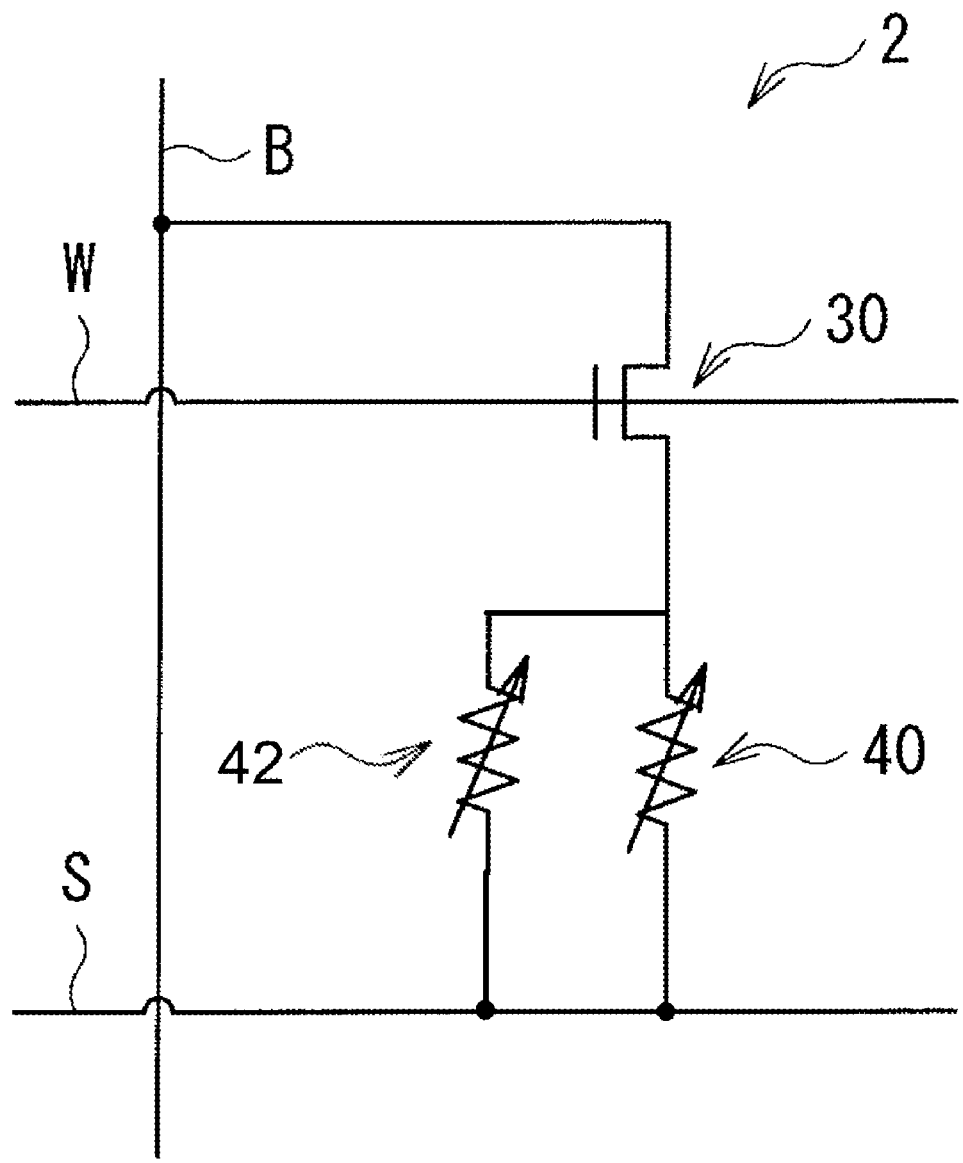
FIG. 21 is a circuitry diagram of the memory cell of FIG. 7 with the addition of a nonlinear resistance element in parallel with a storage element.

FIG. 21 shows the memory cell 2 of FIG. 7 with the addition of a nonlinear resistance element 42 electrically connected in parallel with the storage element 40. Similar to FIG. 7, the MOS transistor 30 is electrically connected in series with the storage element 40. Here, the storage element 40 has a nonlinear current-voltage characteristic opposite to a nonlinear current-voltage characteristic of the MOS transistor 30. Additionally, the storage element 40 changes into a high or low resistance state in accordance with a polarity of an applied voltage. The nonlinear resistance element 42 has a nonlinear current-voltage characteristic similar to the nonlinear current-voltage characteristic of the storage element 40. The nonlinear resistance element 42 also has a lower resistance value than a resistance value of the storage element 40 in a high-resistance state of the storage element 40.

Example of Second Embodiment

Figure 9:
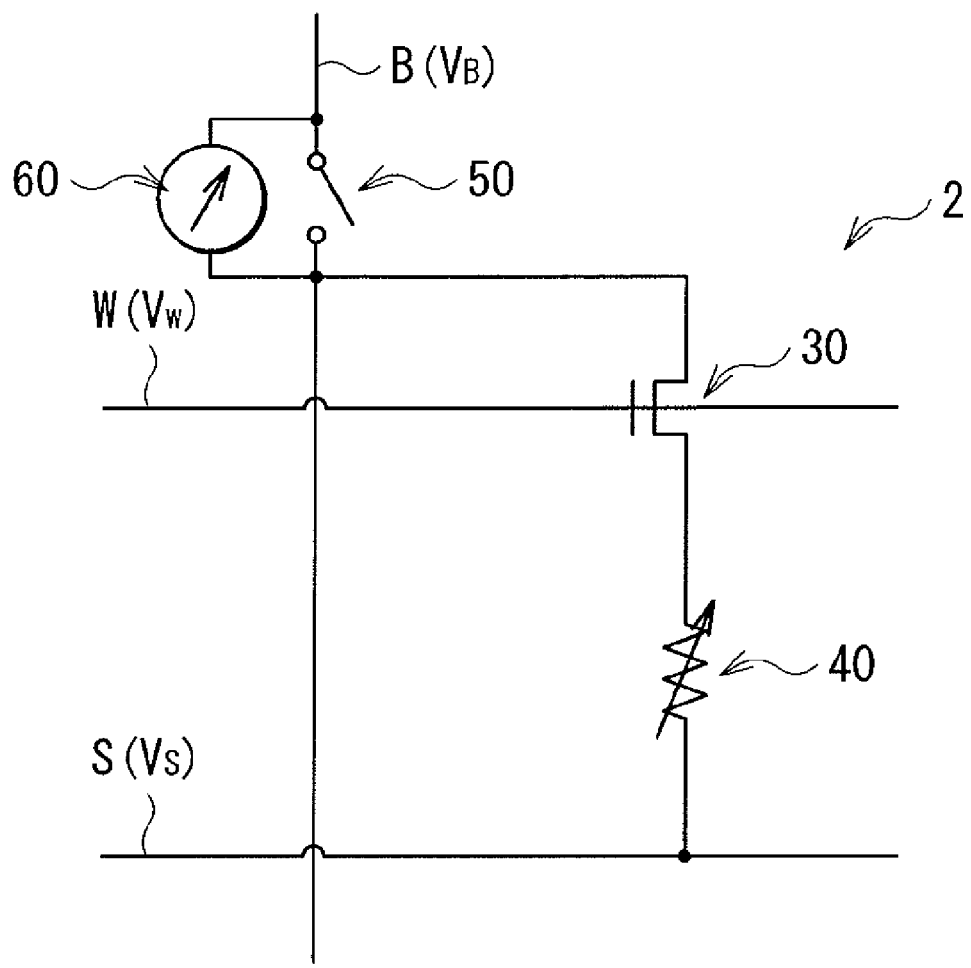
FIG. 9 is a schematic configuration diagram of an apparatus for measuring a current-voltage characteristic of the memory cell of FIG. 7.
Figure 10:
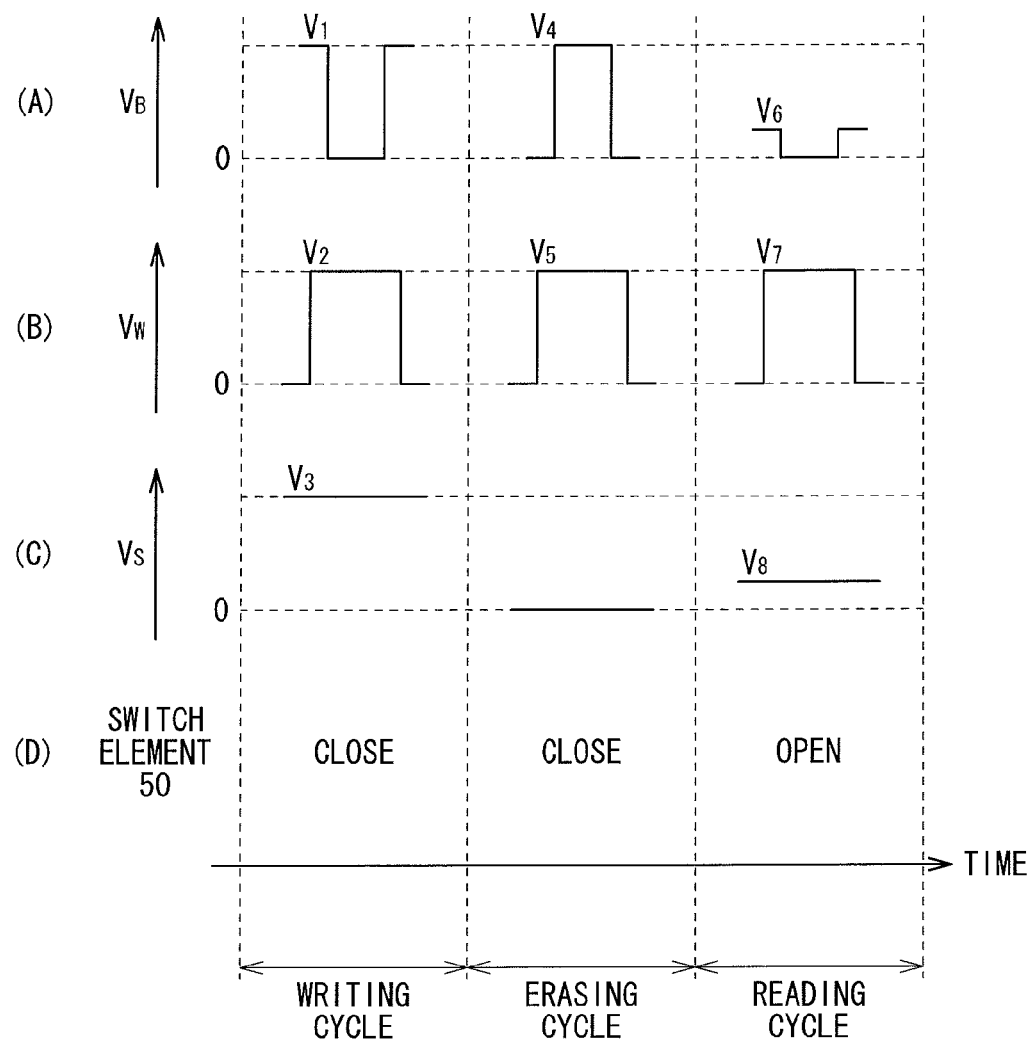
FIG. 10 is input waveform diagrams for each cycle.

FIG. 9 shows a schematic configuration of an apparatus where the memory cell 2 of the second embodiment has a switch element 50 on a bit line B, and has an ammeter 60 in parallel with the switch element 50. In the example, resistance distribution in the memory cell 2 was measured using the apparatus. At that time, the voltage control film 41 was configured of SiWN, and a Si/W ratio of SiWN was appropriately adjusted so that a resistance value of the voltage control film 41 was 1 MΩ. In addition, resistance distribution in the memory cell 2 was measured using various voltage waveforms (a bit line voltage $V_B$, a word line voltage $V_W$, and a source line voltage $V_S$) shown in (A) to (C) of FIG. 10.

Figure 11:
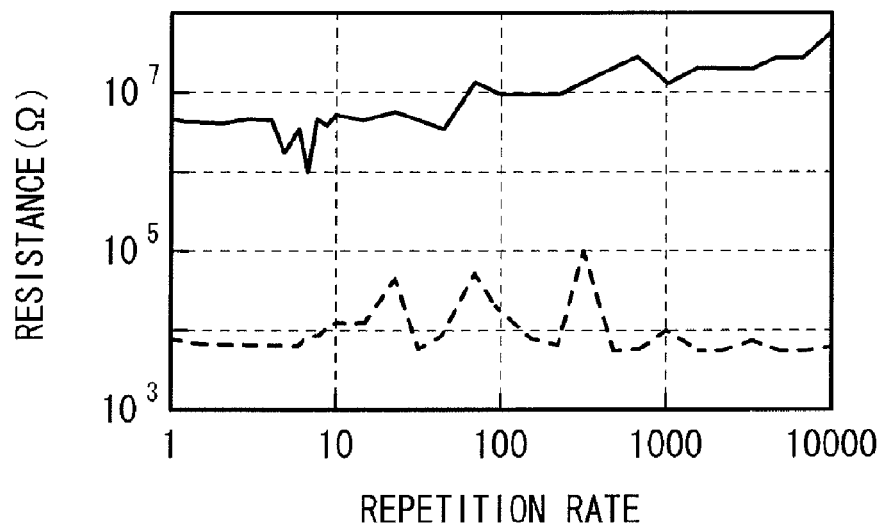
FIG. 11 is a resistance distribution diagram of a storage element according to a comparative example.
Figure 12:
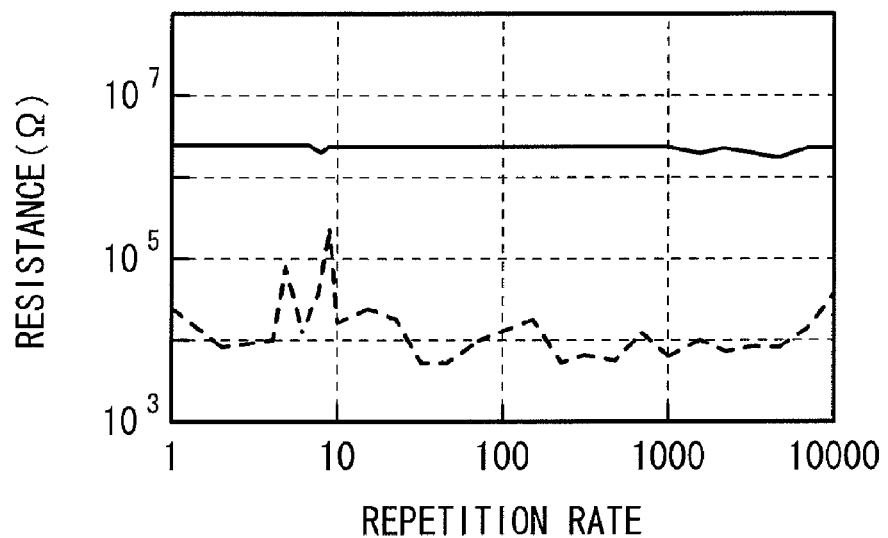
FIG. 12 is a resistance distribution diagram of a storage element according to an example.

In a writing cycle, the bit line voltage $V_B$ was changed from $V_1$ (3 V) to zero V, the word line voltage $V_W$ was changed from zero V to $V_2$ (1.3 V), and the source line voltage $V_S$ was kept to $V_3$ (3 V) while pulse width of the bit line voltage $V_B$ was 10 μsec. In an erasing cycle, the bit line voltage $V_B$ was changed from zero V to $V_4$ (1.7 V), the word line voltage $V_W$ was changed from zero V to $V_5$ (2.5 V), and the source line voltage $V_S$ was kept to zero V while pulse width of the bit line voltage $V_B$ was 10 μsec. In a reading cycle, the bit line voltage $V_B$ was changed from $V_6$ (0.1 V) to zero V, the word line voltage $V_W$ was changed from zero V to $V_7$ (2.5 V), and the source line voltage $V_S$ was kept to $V_8$ (0.1 V). FIG. 11 shows a result of a measurement of a memory cell where the voltage control film 41 is replaced by the interlayer insulating film 12 in the memory cell 2 of the second embodiment (a comparative example), and FIG. 12 shows a result of a measurement of the memory cell 2 of the second embodiment (the example). In each of FIGS. 11 and 12, a horizontal axis shows a repetition rate, and a vertical axis shows a resistance value of the memory cell.

From FIGS. 11 and 12, while erasing resistance was gradually increased with increase in repetition rate in the comparative example, erasing resistance was independent of a repetition rate, and approximately constant in the example. From this, it was found that multivalence was able to be achieved on at least an erasing resistance side in the example.

Third Embodiment

Figure 13:
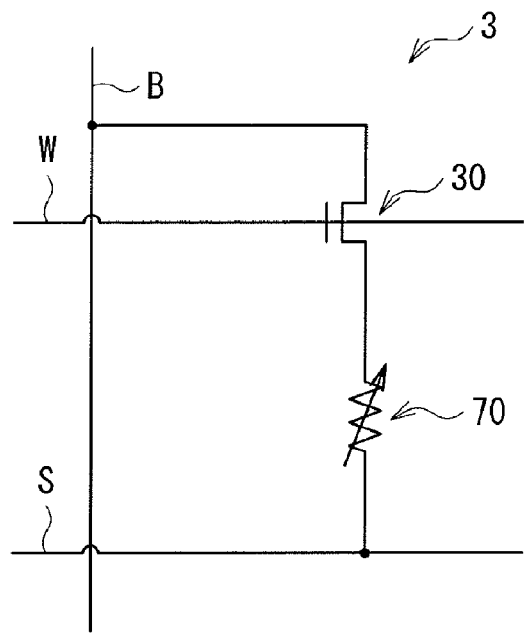
FIG. 13 is a circuitry diagram of a memory cell according to a third embodiment of the invention.

A storage device according to a third embodiment of the invention includes memory cells 3 arranged in matrix as storage units. FIG. 13 shows the memory cell 3 of the storage device in an enlarged manner. The memory cell 3 is formed by connecting a storage element 70 and an MOS transistor 30 in series.

Figure 14:
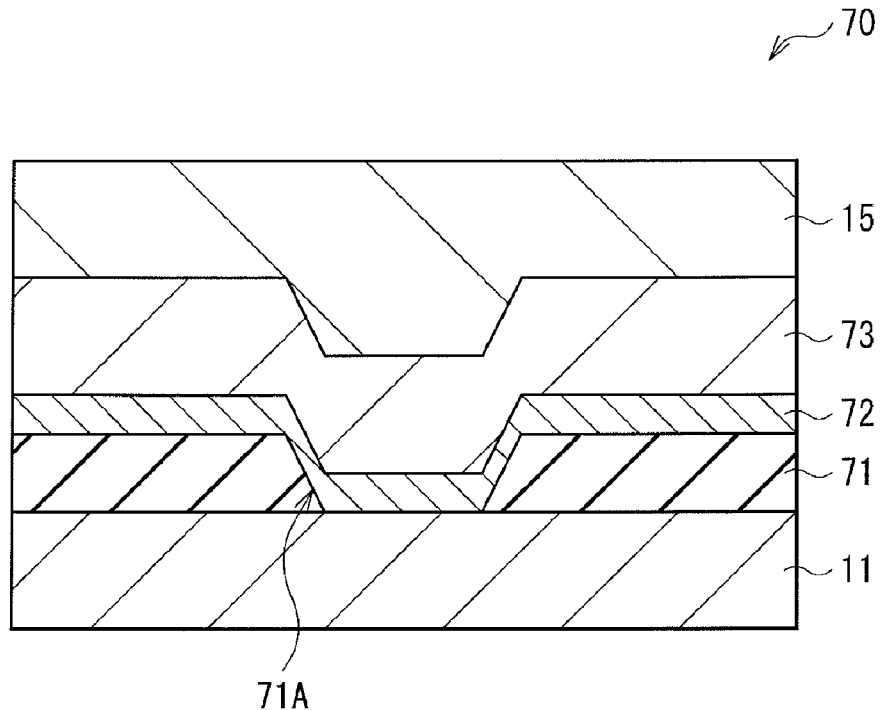
FIG. 14 is a sectional configuration diagram of a storage element in FIG. 13.

FIG. 14 shows an example of a sectional configuration of the storage element 70. The storage element 70 is formed by stacking an electrode 11, an interlayer insulating film 71, a voltage control film 72, a resistance change layer 73, and an electrode 15 in this order. The electrode 11 is electrically connected to a source line S, and the electrode 15 is electrically connected to a drain (not shown) of the MOS transistor 30. A source (not shown) of the MOS transistor 30 is electrically connected to a bit line B, and a gate (not shown) of the MOS transistor 30 is electrically connected to a word line W.

The interlayer insulating film 71 includes, for example, a hard-cured photoresist, $SiO_2$, $Si_3N_4$, an inorganic material (for example, SiON, SiOF, $Al_2O_3$, $Ta_2O_5$, $HfO_2$ or $ZrO_2$), a fluorine series organic material, or an aromatic series organic material, and thickness of the film is small, 10 μm or less, for example. Thus, the interlayer insulating film 71 is semiconductive.

As shown in FIG. 14, the interlayer insulating film 71 has an opening 71A running through the interlayer insulating film 71, and is contacted to the electrode 11, and the electrode 11 and the voltage control film 72 are thus contacted to each other via the opening 71A. That is, a region of the voltage control film 72 opposed to the opening 71A of the interlayer insulating film 71 is contacted to the electrode 11, and a region of the voltage control film 72 other than the region thereof opposed to the opening 71A of the interlayer insulating film 71 is contacted to the interlayer insulating film 71, and oppositely disposed to the electrode 11 via the interlayer insulating film 71.

The voltage control film 72 includes a material having a resistance value lower than a resistance value of the interlayer insulating film 71, for example, SiWN. The resistance change layer 73 includes, for example, at least one kind of metal elements of Cu, Ag and Zn, and at least one kind of chalcogen elements of Te, S and Se, and, for example, includes CuTeSi, GeSbTeSi, CuGeTeSi, AgTeSi, AgGeTeSi, ZnTeSi, ZnGeTeSi, CuSSi, CuGeSSi, CuSeSi, or CuGeSeSi.

A resistance component (hereinafter, called third resistance component) formed by a region of the resistance change layer 73 corresponding to the opening 71A has a nonlinear current-voltage characteristic opposite to a nonlinear current-voltage characteristic of the MOS transistor 30, and specifically has a nonlinear current-voltage characteristic expressed by $I=cV^d$ (I is a current flowing through the third resistance component, V is a voltage applied to the third resistance component, c is a coefficient, and d is a power larger than 1) as shown in FIG. 4. Therefore, when the memory cell 1 is applied with a voltage within a range where current is not significantly limited by the MOS transistor 30, a voltage applied to the third resistance component is increased with increase in voltage applied to the memory cell 3, and a current flowing into the third resistance component is increased in proportion to a voltage, which is applied to the third resistance component, to the power of d.

In the storage element 70, a resistance component (hereinafter, called fourth resistance component) formed by a region of the voltage control film 72 corresponding to the opening 71A, and a resistance component (hereinafter, called fifth resistance component) formed by a part (bottom) of a region of the resistance change layer 73 corresponding to the opening 71A and the periphery (a region of the voltage control film 72 and a region of the interlayer insulating film 71, each region corresponding to the periphery of the opening 71A) of the part of the region are electrically connected in parallel with each other by a part (top) of the region of the resistance change layer 73 corresponding to the opening 71A and the electrode 11.

The fourth resistance component has a nonlinear current-voltage characteristic opposite to a nonlinear current-voltage characteristic of the MOS transistor 30, and specifically has a nonlinear current-voltage characteristic expressed by $I=eV^f$ (I is a current flowing through the sixth resistance component, V is a voltage applied to the fourth resistance component, e is a coefficient, and f is a power larger than 1) as shown in FIG. 5. Therefore, when the memory cell 3 is applied with a voltage within a range where current is not significantly limited by the MOS transistor 30, a voltage applied to the fourth resistance component is increased with increase in voltage applied to the memory cell 3, and a current flowing into the fourth resistance component is increased in proportion to a voltage, which is applied to the fourth resistance component, to the power of f.

The fifth resistance component has a nonlinear current-voltage characteristic similar to the nonlinear current-voltage characteristic of the fourth resistance component, namely, has a nonlinear current-voltage characteristic opposite to the nonlinear current-voltage characteristic of the MOS transistor 30. The fifth resistance component also has a nonlinear current-voltage characteristic expressed by $I=eV^f$ (I is a current flowing through the fifth resistance component, V is a voltage applied to the fifth resistance component, e is a coefficient, and f is a power larger than 1) as shown in FIG. 5. Therefore, when the memory cell 3 is applied with a voltage within a range where current is not significantly limited by the MOS transistor 30, a voltage applied to the fifth resistance component is increased with increase in voltage applied to the memory cell 3, and a current flowing into the fifth resistance component is increased in proportion to a voltage, which is applied to the fifth resistance component, to the power of f. Each of e and f of the fourth resistance component is different from those of the fifth resistance component.

The power f has a value smaller than a value of the power d of the third resistance component, and a resistance value of each of the fourth and fifth resistance components is smaller than a resistance value of the third resistance component. Therefore, in a high-resistance state of the third resistance component, the fifth resistance component connected in parallel with a resistance component including part of the third resistance component and the fourth resistance component is dominant for a resistance value of the storage element 70 as a whole compared with the resistance component including part of the third resistance component and the fourth resistance component.

Thus, in the embodiment, even if when a writing voltage and an erasing voltage are repeatedly applied to the storage element 70, the third resistance component after applying the erasing voltage is gradually increased with increase in repetition rate, the fifth resistance component, which is connected in parallel with the resistance component including part of the third resistance component and the fourth resistance component, is dominant for the resistance value of the storage element 70 as a whole compared with the resistance component including part of the third resistance component and the fourth resistance component. This may stabilize a resistance value (erasing resistance) of the storage element 70 as a whole after applying the erasing voltage. As a result, since stable erasing resistance independent of a repetition rate may be achieved, multivalence may be achieved on at least an erasing resistance side.

In the embodiment, the voltage control film 72, which has a nonlinear current-voltage characteristic similar to the nonlinear current-voltage characteristic of the resistance component (third resistance component) formed by the region of the resistance change layer 73 corresponding to the opening 71A, namely, has a nonlinear current-voltage characteristic opposite to the nonlinear current-voltage characteristic of the MOS transistor 30, is electrically connected in series with the region of the resistance change layer 73 corresponding to the opening 71A in a region opposed to the opening 71A, and acts as a protective resistance limiting a current flowing into the region of the resistance change layer 73 corresponding to the opening 71A in addition to the MOS transistor 30. Thus, when the memory cell 3 is applied with a voltage so that the storage element 70 is applied with a voltage necessary for changing the resistance change layer 73 into a high or low resistance state, the MOS transistor 30 is applied with a voltage divided by the third and fourth resistance components. Therefore, a voltage applied to the memory cell 3 may be controlled to have a value within a range where current is not significantly limited by the MOS transistor 30.

As a result, in the embodiment, when a high voltage ($V_{BS}$) is applied to the memory cell 3, a voltage ($V_A$) applied to the region of the resistance change layer 73 corresponding to the opening 71A may be increased in accordance with magnitude of the voltage ($V_{BS}$) applied to the memory cell 3, for example, as shown by the solid line in FIG. 6. On the other hand, in the past, when a high voltage ($V_{BS}$) is applied to the memory cell 3, a voltage ($V_A$) applied to the region of the resistance change layer 73 corresponding to the opening 71A has been hardly increased due to current limitation of the MOS transistor 30, for example, as shown by the dashed line in FIG. 6. Therefore, in the embodiment, the region of the resistance change layer 73 corresponding to the opening 71A may be applied with a voltage necessary for changing the region into a high or low resistance state.

Example of Third Embodiment

Figure 15:
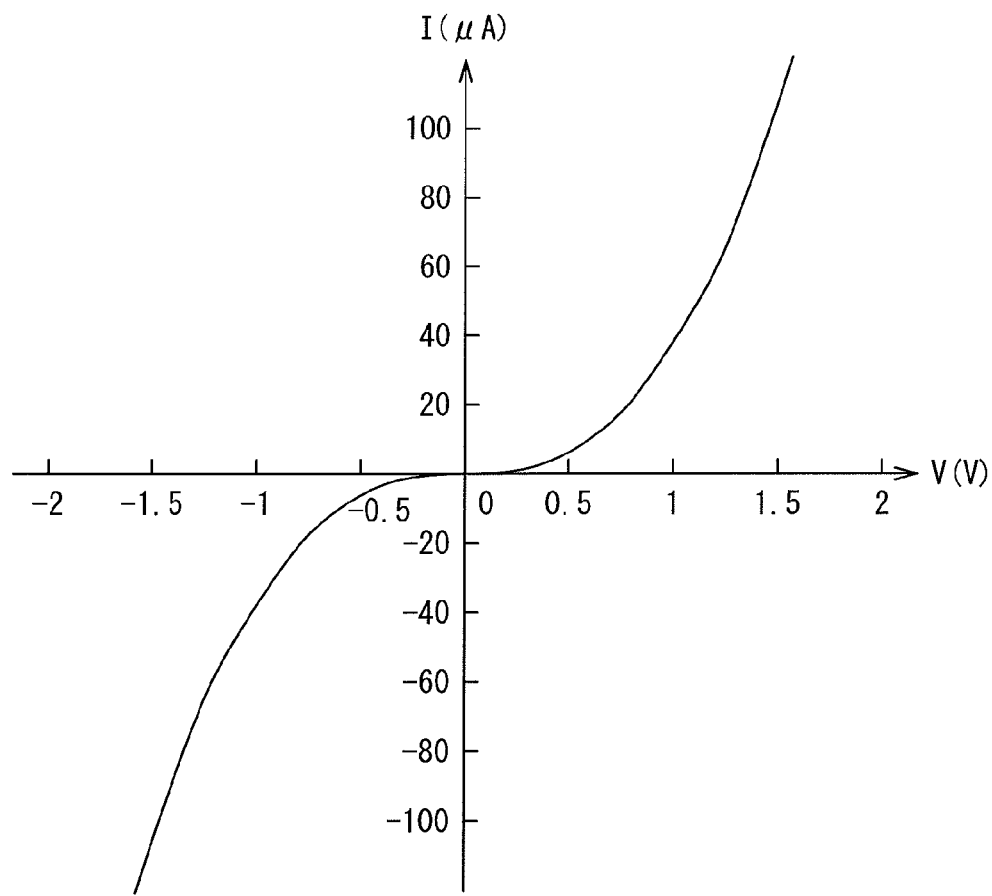
FIG. 15 is a current-voltage characteristic diagram of the storage element in FIG. 13.

FIG. 15 shows a current-voltage characteristic measured in an example of the memory cell 3 of the third embodiment. In the example, the interlayer insulating film 71 was formed of $Si_3N_4$ with 10 nm in thickness, the voltage control film 72 was formed of SiWN, and the resistance change layer 73 was formed of CuGeSiTe with 26 nm in thickness. Inner diameter (diameter) of the opening 71A of the interlayer insulating film 71 was 60 nm.

From FIG. 15, it was found that a current value of the memory cell 3 was proportional to a voltage value to the power of approximately 2.6, and each of the fifth, sixth and seventh resistance components had a nonlinear current-voltage characteristic opposite to the nonlinear current-voltage characteristic of the MOS transistor 30.

Figure 16:
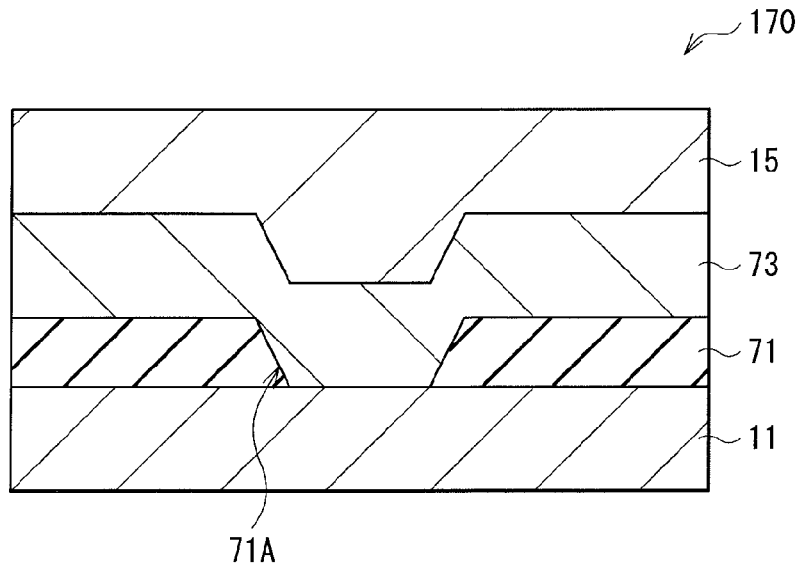
FIG. 16 is a sectional configuration diagram of a storage element according to a comparative example.
Figure 17:
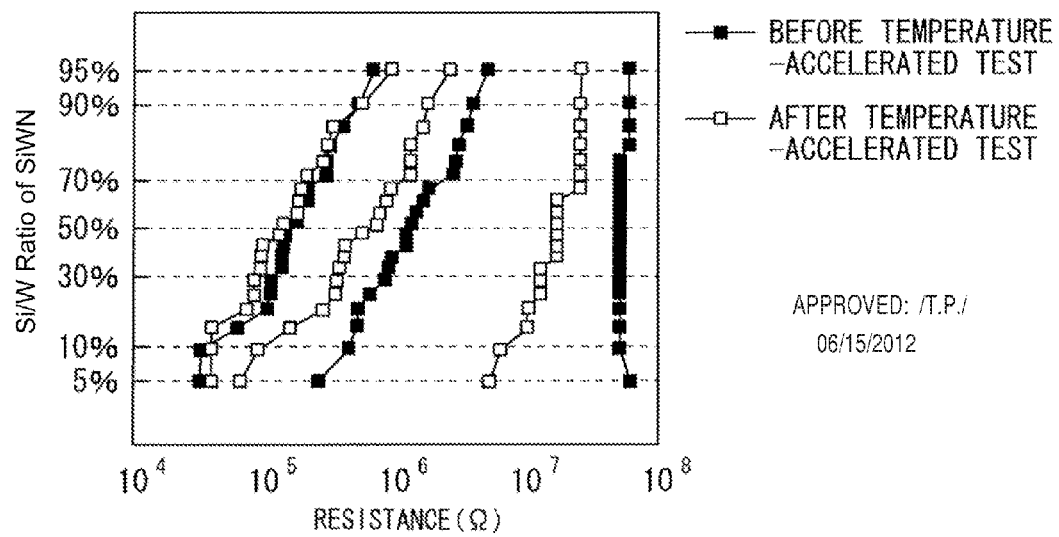
FIG. 17 is a characteristic diagram for illustrating a data holding characteristic of the storage element according to the comparative example.
Figure 18:
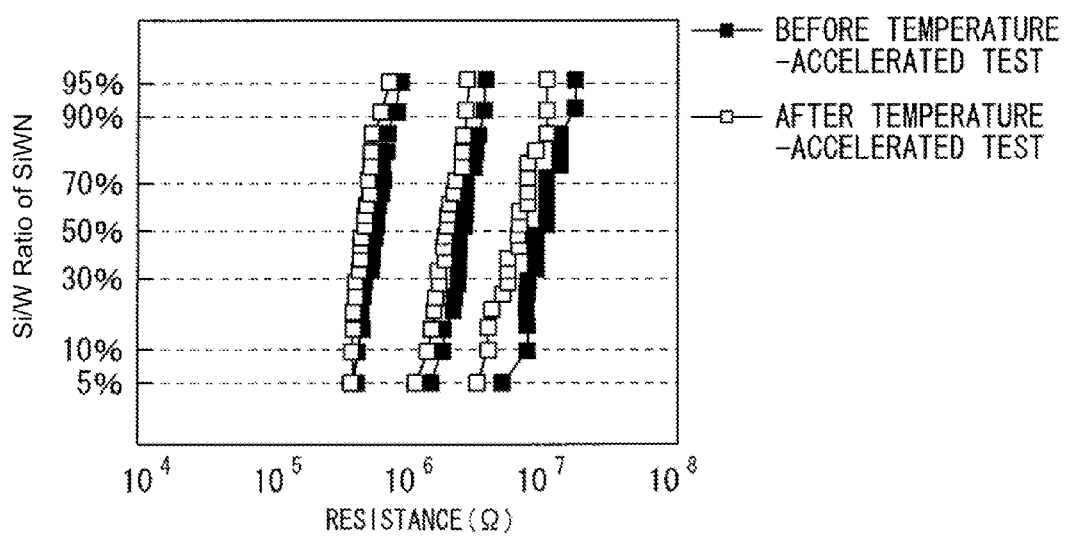
FIG. 18 is a characteristic diagram for illustrating a data holding characteristic of a storage element according to an example.
Figure 19:
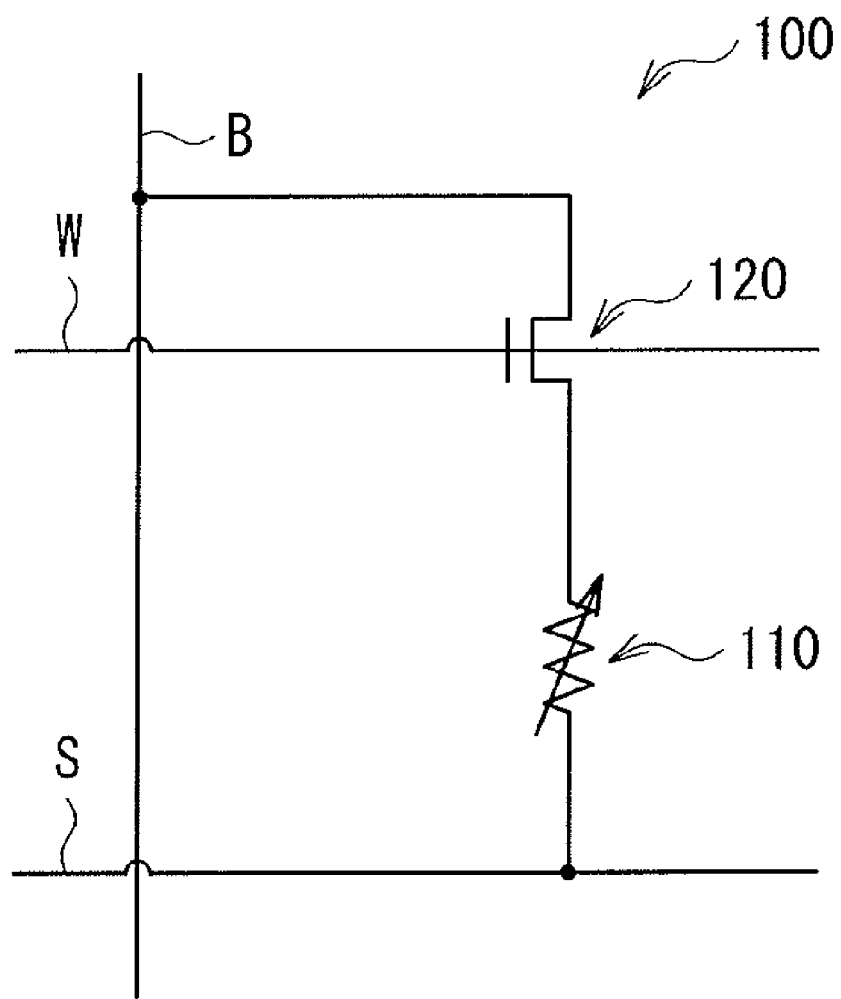
FIG. 19 is a circuitry diagram of a prior art memory cell.

FIG. 16 shows a schematic configuration of a storage element as a comparative example, which is configured by removing the voltage control film 72 from the memory cell 3 of the third embodiment. In a storage element 170 according to the comparative example, the resistance change layer 73 and the electrode 11 were contacted to each other in the opening 71A of the interlayer insulating film 71. First, 20 pieces of the storage elements 70 according to the example, and 20 pieces of the storage elements 170 according to the comparative example were prepared, and resistance values of the storage elements 70 and 170 were measured for each of erasing voltage conditions before a temperature-accelerated test. Then, the storage elements 70 and 170, of which the resistance values had been measured, were held in a vacuum layer at 130° C. for 1 hour to be subjected to the temperature-accelerated test therein, and then resistance values of the storage elements 70 and 170 were measured again. FIG. 17 shows measurement results of the storage elements 170 according to the comparative example, and FIG. 18 shows measurement results of the storage elements 70 according to the example. Voltage of the MOS transistor 30 in erasing was 3.4 V, and erasing voltage conditions were 1.6 V, 2 V and 2.8 V.

From FIGS. 17 and 18, it was found that resistance distribution before the temperature-accelerated test was stable in the storage elements 70 according to the example having the voltage control film 72, and besides, resistance distribution after the temperature-accelerated test was approximately the same as resistance distribution before the temperature-accelerated test in the storage elements 70 compared with the storage elements 170 according to the comparative example without having the voltage control film 72, showing an excellent resistance holding characteristic of the storage elements 70. In each of FIGS. 17 and 18, a horizontal axis shows a resistance value of the memory cell, and a vertical axis shows a Si/W ratio of SiWN in a voltage control film for the respective examples.

While the storage element and the storage device of the invention have been described with the embodiments and the examples hereinbefore, the invention is not limited to the embodiments and the like, and the configurations of the storage element and the storage device of the invention may be freely modified or altered as long as the same advantages as in the embodiments and the like may be obtained thereby.

For example, the number of layers included in the ion source layer 14 is not limited to two, and may be at least three or one.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. A memory cell comprising:
   an MOS transistor, a storage element, and a first nonlinear resistance element, those being electrically connected in series,
   wherein the storage element has a nonlinear current-voltage characteristic opposite to a nonlinear current-voltage characteristic of the MOS transistor, and changes into a high or low resistance state in accordance with a polarity of applied voltage, and
   the first nonlinear resistance element has a nonlinear current-voltage characteristic similar to the nonlinear current-voltage characteristic of the storage element.

2. The memory cell according to claim 1,
   wherein the MOS transistor has the nonlinear current-voltage characteristic expressed by $I=aV^b$ (I is a current flowing through the MOS transistor, V is a voltage applied to the MOS transistor, a is a coefficient, and b is a power less than 1),
   the storage element has the nonlinear current-voltage characteristic expressed by $I=cV^d$ (I is a current flowing through the storage element, V is a voltage applied to the storage element, c is a coefficient, and d is a power larger than 1), and the first nonlinear resistance element has the nonlinear current-voltage characteristic expressed by $I=eV^f$ (I is a current flowing through the first nonlinear resistance element, V is a voltage applied to the first nonlinear resistance element, e is a coefficient, and f is a power larger than 1).

3. The memory cell according to claim 2,
wherein the power f is smaller than the power d.

4. The memory cell according to claim 1 further comprising:
a second nonlinear resistance element electrically connected in parallel with the storage element,
wherein the second nonlinear resistance element has a nonlinear current-voltage characteristic similar to the nonlinear current-voltage characteristic of the storage element, and has a resistance value lower than a resistance value of the storage element in a high-resistance state of the storage element.

5. The memory cell according to claim 4,
wherein the second nonlinear resistance element has the nonlinear current-voltage characteristic expressed by $I=gV^h$ (I is a current flowing through the second nonlinear resistance element, V is a voltage applied to the second nonlinear resistance element, g is a coefficient, and h is a power larger than 1).

6. The memory cell according to claim 5,
wherein the power h is smaller than the power d.

7. A memory cell comprising:
an MOS transistor electrically connected in series with a storage element electrically connected in parallel with a nonlinear resistance element,
wherein the storage element has a nonlinear current-voltage characteristic opposite to a nonlinear current-voltage characteristic of the MOS transistor, and changes into a high or low resistance state in accordance with a polarity of applied voltage, and
the nonlinear resistance element has a nonlinear current-voltage characteristic similar to the nonlinear current-voltage characteristic of the storage element, and has a lower resistance value than a resistance value of the storage element in a high-resistance state of the storage element.

8. The memory cell according to claim 7,
wherein the MOS transistor has the nonlinear current-voltage characteristic expressed by $I=aV^b$ (I is a current flowing through the MOS transistor, V is a voltage applied to the MOS transistor, a is a coefficient, and b is a power less than 1),
the storage element has the nonlinear current-voltage characteristic expressed by $I=cV^d$ (I is a current flowing through the storage element, V is a voltage applied to the storage element, c is a coefficient, and d is a power larger than 1), and
the nonlinear resistance element has the nonlinear current-voltage characteristic expressed by $I=eV^f$ (I is a current flowing through the nonlinear resistance element, V is a voltage applied to the nonlinear resistance element, e is a coefficient, and f is a power larger than 1).

9. The memory cell according to claim 8,
wherein the power f is smaller than the power d.

10. A memory cell comprising:
an MOS transistor, a storage element, and a nonlinear resistance element, those being electrically connected in series,
wherein the storage element has a first electrode, an interlayer separation film having an opening and being contacted to the first electrode, a resistance change layer being contacted to the interlayer separation film and contacted to the first electrode via the opening, an ion source layer being contacted to the resistance change layer, and a second electrode being contacted to the ion source layer,
the resistance change layer has a nonlinear current-voltage characteristic opposite to a nonlinear current-voltage characteristic of the MOS transistor, and changes into a high or low resistance state in accordance with a polarity of applied voltage, and
the nonlinear resistance element has a nonlinear current-voltage characteristic similar to the nonlinear current-voltage characteristic of the resistance change layer.

11. The memory cell according to claim 10,
wherein the interlayer separation film includes an insulating material.

12. The memory cell according to claim 10,
wherein the resistance change layer includes a rare-earth oxide, a rare-earth nitride, a silicon oxide, or a silicon nitride, and
the ion source layer includes at least one kind of metal elements of Cu, Ag and Zn, and at least one kind of chalcogen elements of Te, S and Se.

13. A memory cell comprising:
an MOS transistor and a storage element electrically connected in series with each other,
wherein the storage element has a first electrode, an interlayer separation film having an opening and being contacted to the first electrode, a resistance change layer being contacted to the interlayer separation film and contacted to the first electrode via the opening, an ion source layer being contacted to the resistance change layer, and a second electrode being contacted to the ion source layer,
the resistance change layer has a nonlinear current-voltage characteristic opposite to a nonlinear current-voltage characteristic of the MOS transistor, and changes into a high or low resistance state in accordance with a polarity of applied voltage, and
the interlayer separation film has a nonlinear current-voltage characteristic similar to the nonlinear current-voltage characteristic of the resistance change layer, and has a lower resistance value than a resistance value of the resistance change layer in a high-resistance state of the resistance change layer.

14. The memory cell according to claim 13,
wherein the interlayer separation film includes SiWN.

15. The memory cell according to claim 13,
wherein the resistance change layer includes a rare-earth oxide, a rare-earth nitride, a silicon oxide, or a silicon nitride, and
the ion source layer includes at least one kind of metal elements of Cu, Ag and Zn, and at least one kind of chalcogen elements of Te, S and Se.

16. A memory cell comprising:
an MOS transistor and a storage element electrically connected in series with each other,
wherein the storage element has a first electrode, an interlayer separation film having an opening and being contacted to the first electrode, a voltage control film being contacted to the interlayer separation film and contacted to the first electrode via the opening, a resistance change layer being contacted to the voltage control film, and a second electrode being contacted to the resistance change layer, the resistance change layer has a nonlinear current-voltage characteristic opposite to a nonlinear current-voltage characteristic of the MOS transistor, and changes into a high or low resistance state in accordance with a polarity of applied voltage, and the voltage control film has a nonlinear current-voltage characteristic similar to the nonlinear current-voltage characteristic of the resistance change layer, and has a lower resistance value than a resistance value of the resistance change layer in a high-resistance state of the resistance change layer.

17. The memory cell according to claim 16, wherein the interlayer separation film includes an insulating material.

18. The memory cell according to claim 16, wherein the voltage control film includes SiWN.

19. The memory cell according to claim 16, wherein the resistance change layer includes at least one kind of metal elements of Cu, Ag and Zn, and at least one kind of chalcogen elements of Te, S and Se.

* * * * *